(12) United States Patent
Abdel-Maguid et al.

(10) Patent No.: US 6,480,047 B2
(45) Date of Patent: Nov. 12, 2002

(54) REDUCED JITTER PHASE LOCK LOOP USING A TECHNIQUE MULTI-STAGE DIGITAL DELAY LINE

(75) Inventors: Hazem Abdel-Maguid, Nepean (CA); Simon J. Skierszkan, Kanata (CA)

(73) Assignee: Zarlink Semiconductor Inc., Kanata (CA)

( * ) Notice: Subject to any disclaimer, the term of this patent is extended or adjusted under 35 U.S.C. 154(b) by 0 days.

(21) Appl. No.: 09/858,543

(22) Filed: May 17, 2001

(65) Prior Publication Data

US 2002/0008557 A1 Jan. 24, 2002

(30) Foreign Application Priority Data

May 31, 2000 (GB) .............................................. 0013059

(51) Int. Cl.[7] .............................................. H03L 7/00
(52) U.S. Cl. ...................... 327/161; 327/159; 327/160; 375/376; 331/1 A; 331/DIG. 2
(58) Field of Search .................................. 327/144–147, 327/149, 150–153, 155, 156, 158–161, 162, 261, 263, 269, 276, 284; 375/373, 375, 376, 362; 331/17.25, 1 A, 40, 177 R, DIG. 2; 365/233, 233.5, 194

(56) References Cited

U.S. PATENT DOCUMENTS

| | | | |
|---|---|---|---|
| 4,494,021 A | 1/1985 | Bell et al. | 327/262 |
| 4,577,163 A | 3/1986 | Culp | 331/1 A |
| 5,109,394 A | * 4/1992 | Hjerpe et al. | 375/373 |
| 5,140,620 A | 8/1992 | Woodward | 375/175 |
| 5,218,314 A | 6/1993 | Efendovich et al. | 327/152 |
| 5,602,884 A | 2/1997 | Wieczorkiewicz et al. | 327/156 |
| 5,604,775 A | * 2/1997 | Saitoh et al. | 331/25 |
| 6,100,735 A | * 8/2000 | Lu | 327/158 |

FOREIGN PATENT DOCUMENTS

| | | |
|---|---|---|
| EP | 0 185 779 | 12/1984 |
| EP | 0 520 127 A1 | 6/1991 |
| JP | 10022823 | 1/1998 |
| WO | 96/03808 | 8/1996 |

* cited by examiner

Primary Examiner—Timothy P. Callahan
Assistant Examiner—Minh Nguyen
(74) Attorney, Agent, or Firm—Marks & Clerk (57) ABSTRACT

A digital phase locked loop (PLL) for recovering a stable clock signal from at least one input signal subject to jitter. The PLL has a digital controlled oscillator for generating a desired output and a stable local oscillator or providing clock signals. A plurality of hierarchical, multi-stage delay lines are provided to generate the required output frequencies for stable T1, E1 and ST3/OC3 timing references.

17 Claims, 8 Drawing Sheets

REDUCED JITTER PHASE LOCK LOOP USING A TECHNIQUE MULTI-STAGE DIGITAL DELAY LINE

FIELD OF THE INVENTION

This invention relates in general to digital timing circuits, and more particularly to a digital phase locked loop capable of recovering a clock signal from one or more inputs signals subject to jitter.

DESCRIPTION OF THE PRIOR ART

In digital networking applications, there is a requirement to provide timing reference for the SONET (synchronous optical network) OC-N and STS-N interface circuits, and T1 or E1 primary rate digital transmission links. These timing signals must meet relevant standards such as BELLCORE GR-1244-CORE and GR-253-CORE recommendations for STRATUM 3E3 and 4E clocks and SONET Minimum Clock (SMC). These specifications impose strict requirements on jitter and stability.

The common method of providing such timing signals is to use a phase locked loop (PLL). Typically, a PLL consists of a phase detector that compares the input signal with the output of the loop divided by a suitable factor; a loop filter to eliminate high frequency fluctuations; and a controlled oscillator whose frequency is controlled in such a way as to eliminate the phase difference detected by the phase detector.

It has long been known to employ a VCO (voltage controlled oscillator) as the controlled oscillator in the loop. U.S. Pat. No. 4,577,163 discloses a phase lock loop in which the VCO is replaced by a DCO (digital controlled oscillator) whose output is divided by factor K and fed back to the phase detector. In the '163 patent, the DCO is clocked by a clock signal Fclk. Since the DCO cannot respond to a phase shift less than one clock cycle, Fclk is the limiting factor for accuracy in this type of phase locked loop. In order to meet BELLCORE and SMC specifications, a local oscillator having a frequency of 5 GHz or more must be employed. Such a high frequency local oscillator is expensive, energy consuming, and prone to the emission of electromagnetic interference (EMI).

U.S. Pat. No. 5,218,314 discloses a phase locked loop in which a local oscillator feeds a tapped delay line. The output signal is taken from one of the taps of the delay line according to a phase comparison effected with the input signal. The problem with this arrangement is that it provides no jitter suppression for the reference signals. As a practical matter, due to the inherent properties of the transmission medium, incoming signals will be subject to jitter, and this must be substantially suppressed in order to meet the BELLCORE specifications.

U.S. Pat. No. 5,602,884, the contents of which are incorporated herein by reference, discloses a phased locked loop using a combination of a DCO clocked by a 20 MHz clock and a tapped delay line. Since the DCO directly controls the tapped delay line, jitter free precision can be maintained to a fraction of a clock cycle. The fraction is limited by the delay time of each tap of the tapped delay line. Using a tapped delay line with 64 taps, a typical unfiltered intrinsic output jitter is 0.04 UI (Unit Interval) peak-to-peak. In order to meet SMC specifications, a tapped delay line with 1024 taps would have to be employed.

The conventional approach in using a tapped delay line is using fixed delay taps, where a chain of either similar buffers or similar inverters, having the same delay time, are connected in series. A 20 MHz local oscillator reference clock (50 nsec) can not easily be divided in 50 psec or smaller delay steps due to both the size of the hardware and the power consumption. A 50 psec delay step fits 1000 times in 50 nsec. For example, the 64 taps in a Multitrunk System Synchronizer available from Mitel Corporation under the product number MT9042 requires about 2k gates. Using the same solution for a 50 psec delay step would require roughly 150k gates, with a power consumption of between 400 mA to 900 mA.

The fundamental disadvantage of the tapped delay line with fixed delay tap is that the delay resolution can only be increased with a linear increase in the number of taps and therefore the number of gates required and power consumption.

An object of the invention is to provide a phase locked loop that alleviates the aforementioned problems with the prior art.

SUMMARY OF THE INVENTION

According to a first aspect of the present invention there is provided a digital phase locked loop for recovering a stable clock signal from at least one input signal subject to jitter, comprising:

a) a digital input circuit receiving the at least one input signal;

b) a digital controlled oscillator for generating an output at a desired frequency and a control signal representing the time error in the output signal;

c) a stable local oscillator for providing clock signals to the digital controlled oscillator;

d) a plurality of tapped delay lines, the tapped delay lines comprising a plurality of delay means, the sum of the delay of the plurality of tapped delay lines being less than one clock cycle of the digital controlled oscillator; the plurality of tapped delay lines including a coarse, tapped delay line for receiving the output signal of the digital controlled oscillator; and a fine, tapped delay line for receiving the output signal of the coarse tapped delay line, the fine tapped delay line comprising a plurality of delay means proportional to one of the coarse tapped delay line; and a digital phase comparator for receiving the at least one input signal from the input circuit and the output signal from the second tapped delay line means to generate a digital input signal controlling the digital controlled oscillator, wherein the digital controlled oscillator is an adding type rate multiplier that generates the output signal when attaining an overflow condition, the remainder term upon attainment of the overflow condition generating the control signal.

According to a second aspect of the present invention there is provided a method of recovering a stable clock signal from at least two input signals subject to jitter, comprising the steps of:

generating local clock signals with a stable oscillator;

clocking a digital controlled oscillator with the local clock signals;

feeding a first output of the digital controlled oscillator to a first tapped delay line;

feeding an output of the first tapped delay line to a second tapped delay line; wherein the second tapped delay line has a proportional relationship to the first tapped delay line;

controlling the first and second tapped delay lines with a second output of the digital controlled oscillator representative of a timing error in the first output to generate clock signals having a precision greater than one clock cycle of the stable oscillator;

controlling the digital controlled oscillator with a digital phase comparator that compares the output thereof with the at least one input signal; and wherein a virtual reference signal is created that has a constant phase relationship to the at least two input signals such that any phase jump occurring on changeover between the input signals is minimized.

BRIEF DESCRIPTION OF THE DRAWINGS

The invention will be described in further detail with reference to the accompanying drawings, in which.

DESCRIPTION OF THE PREFERRED EMBODIMENTS

Figure 1:
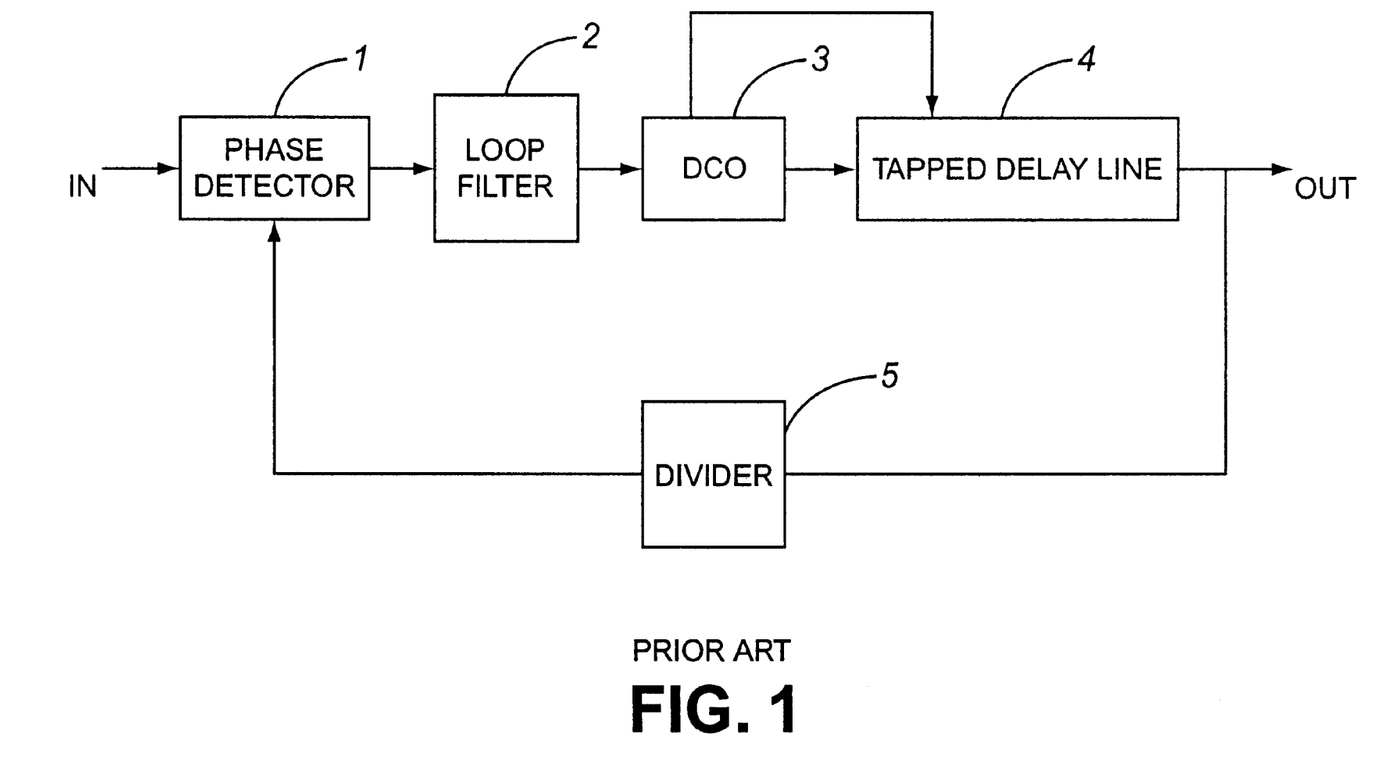
FIG. 1 is a block diagram of a prior art digital phase locked loop.

FIG. 1 illustrates a prior art phase locked loop that comprises a phase detector 1 receiving a reference signal in, a loop filter 2, a digital controlled oscillator 3 for generating an output signal at a desired frequency and a control signal representing the time error in the output signal, a tapped delay line 4 for receiving the output signal of the digital controlled oscillator 3, the tapped delay line 4 producing an output signal from a tap determined by the control signal, and a divider circuit 5 generating a feed back signal for the second input of the phase detector 1. The function of the loop filter 2 is to eliminate high frequency fluctuations in the control signal. The phase detector 1 ensures that the digital controlled oscillator 3 generates an output in synchronism with the input signal in.

Such a prior art phase locked loop does not provide adequate means for eliminating the intrinsic jitter at the output stage for the input signal in, such as is present on SONET systems, unless using a tapped delay line with very large number of small taps (in order of 1024 taps or more), which is unwieldy as discussed above.

Figure 2:
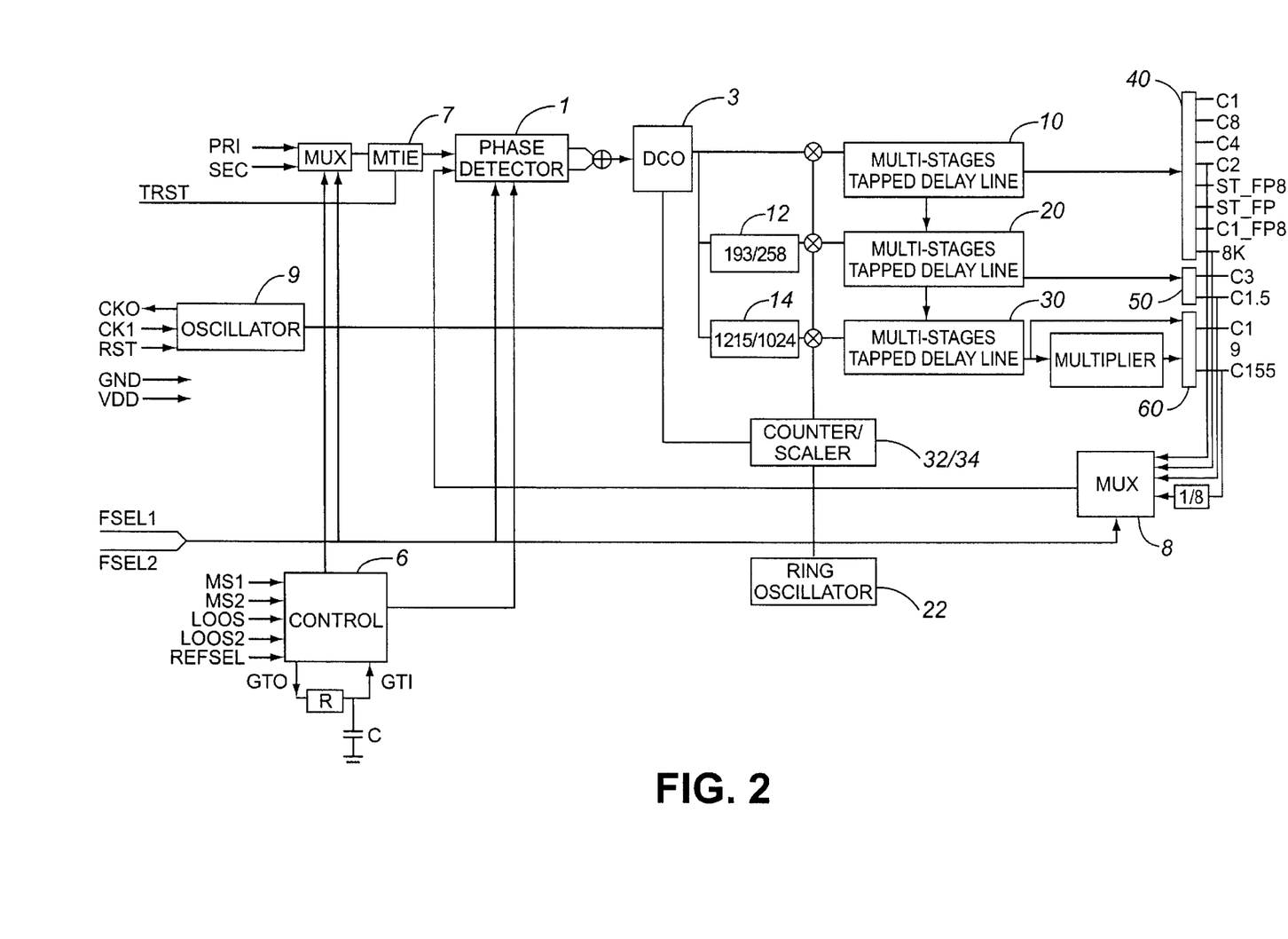
FIG. 2 is a block diagram of a digital locked loop according to the present invention.

Referring to FIG. 2, the phase locked loop in accordance with the present invention comprises a digital phase detector 1 and a digital controlled oscillator 3, feeding respective multi-stage tapped delay lines 10, 20 and 30. Actually each consist of a pair of multi-stage tapped delay lines (see FIG. 8) connected to the output circuitry 40, 50 and 60 respectively and providing a range of clock signals at different frequencies respectively for E1, T1 and STS-3/OC-3. The 19.44 MHz (the STS-3/OC-3 rate divided by 8) clock divided by 8 to generate a reference frequency 2.43 MHz.

The 2.43 MHz and the output circuit clocks are connected through a multiplexer 8 to one of the inputs of the phase detector 1. The other input connected to MTIE circuit 7, whose function will be described in more detail below. The MTIE circuit receives the output of a multiplexer that receives primary and secondary inputs PRI, SEC. PRI and SEC can, for example, be first and second incoming T1 links from which it is desired to generate timing signals for the local interface circuits.

The Control block 6 acts as a state machine controlling the operation of the device. The Oscillator 9 is a stable 20 MHz crystal oscillator with nominal 50-nanosecond cycle duration. The 193/256 block 12 multiplies the output of the DCO 3 by 193/256 to generate timing signals for a T1 interface. The 1215/1024 block 14 multiplies the output by 1215/1024 to generate timing signals for a STS3/OC3 interface.

Figure 3:
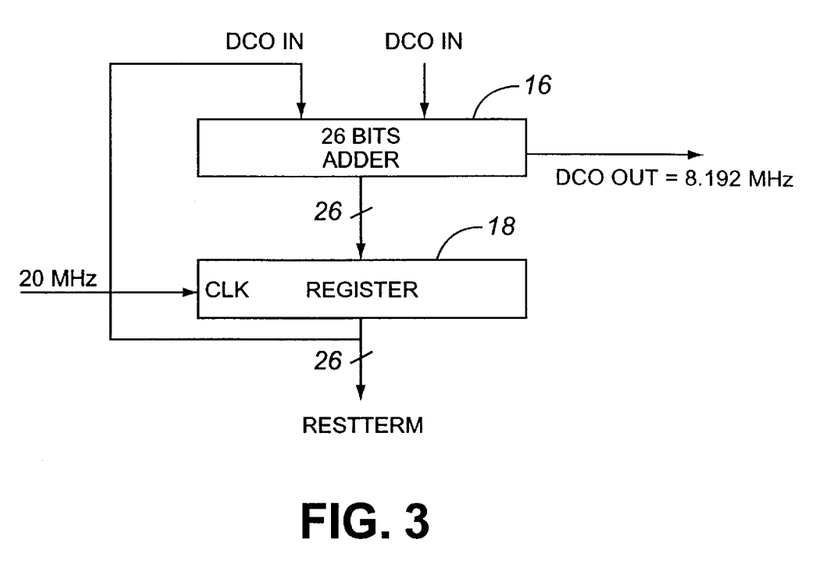
FIG. 3 is a block diagram illustrating details of the digital controlled oscillator of FIG. 2.
Figure 4:
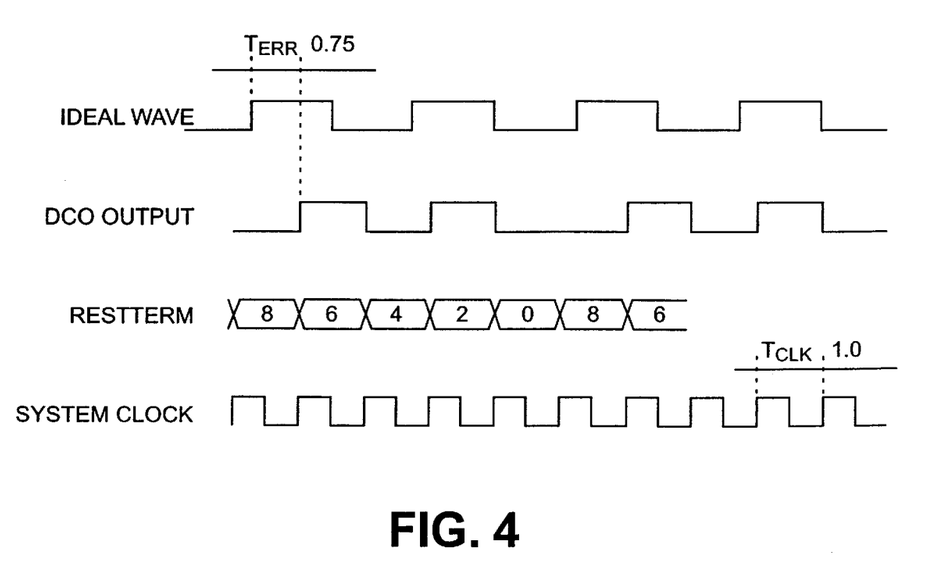
FIG. 4 is a timing diagram associated with the digital controlled oscillator of FIG. 3.

The DCO 3 is shown in more detail in FIG. 3. It comprises an adding rate multiplier 16 that generates the desired output frequency. An input word (DCOin) is fed to adder 16. The DCO is clocked by the 20 MHz signal from stable oscillator. As the input word DCOin is repeatedly added to the initial value of the adder P, the adder periodically overflows and the resulting carry signals constitute the output signal of the DCO. If there is a remainder term at the time of overflow, this appears in register 18 and represents the timing error of the DCO output (FIG. 4). This remainder term (restterm) is used to control the multi-stage tapped delay lines in a manner to be described below.

The DCO generates a main frequency of 16.384 MHz for E1, 12.352 MHz for T1 and 19.44 MHz for STS3/OC3. The frequency generated by the DCO is given by the equation:

$$F_{gen} = (P/Q) \times Fclk/2$$

Where Q is the capacity of the adder, P is the initial value of the adder (P is less than Q) and Fclk equals the clock frequency of the DCO.

Figure 6:
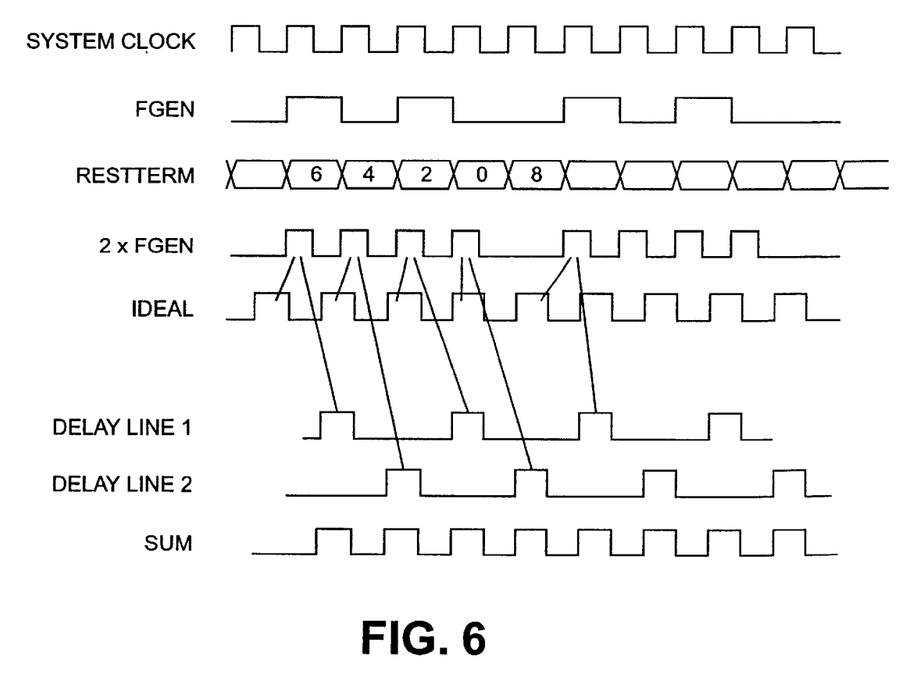
FIG. 6 is a timing chart showing the reference signals.

As the DCO operates on a clock frequency of 20 MHz, in accordance with the Shannon theorem, the maximum frequency that can be generated is 10 MHz, i.e. the sample frequency divided by two. This is apparent from FIG. 6, which shows that the DCO changes state on the leading edges of the clock pulses. However, by replacing every edge in the DCO output with a 25 ns pulse, the DCO output frequency is doubled. This signal (16.384, 12.352 MHz or 19.44 MHz) is adjusted in phase by two sets of multi-stage tapped delay lines. The sum of the outputs thus has double the frequency of $F_{gen}$.

As described in SONET Minimum clock standard GR-253, R5-118 "The initial fractional frequency offset, as defined in T1.105.09, shall be less than 0.05 ppm", where is ppm is part per million, therefore Q value is set to be 26 bits which equals 67,108,864. The value for P required to generate a center frequency of 8.192 MHz is 54,975,581 with less than 0.05 ppm.

The resolution of the DCO is determined by the value of Q, which for one practical embodiment is 67108864, and thus the resolution is 0.5×1 over 67108864×20 MHz=0.149 Hz. The resolution for the generated frequency is only as good as the ratio between the set number P and the least significant bit. Since this ratio is 1/54975581, the relative accuracy around the center frequency is therefore 0.018 ppm. Thus the highest frequency that is generated by the DCO, 16.384 MHz, has a resolution of 0.38 Hz with an accuracy of 0.018 ppm.

Figure 9:
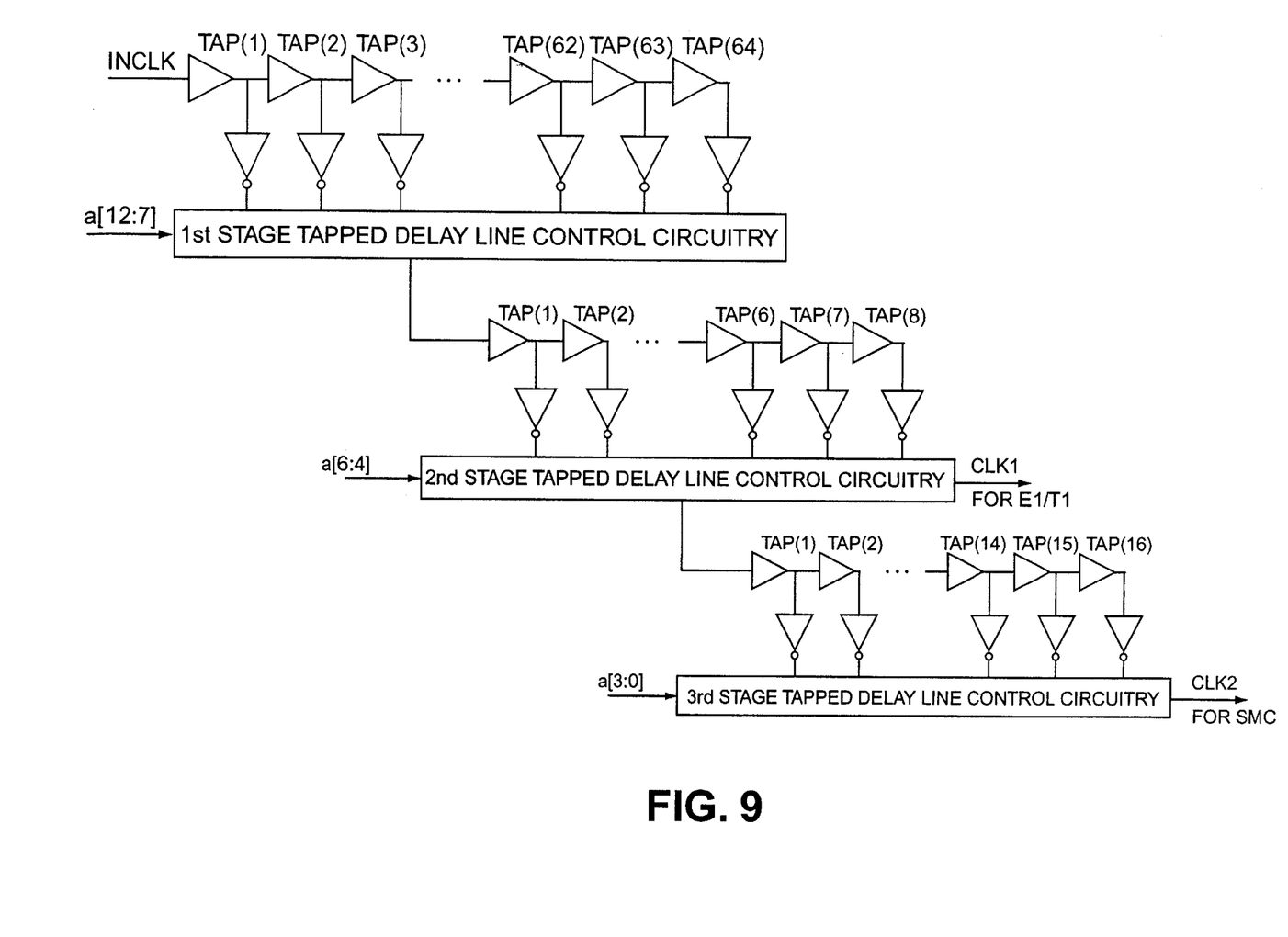
FIG. 9 is a block diagram illustrating details of coarse and fine tapped delay line of FIG. 8.

FIG. 4 shows the output of DCO. This is delayed by a timing error $t_{err}$ indicated by the remainder term in register 18. As indicated above, the output of the DCO is fed to multi-stage tapped delay line pairs (FIG. 9). Each multi-stage tapped delay line consists of a first, coarse, tapped delay line and second, fine, tapped delay line. The first, coarse, tapped delay line consists of a number of delay elements with a total delay of one DCO clock cycle. The first, coarse, tapped delay line output is fed to the second, fine, tapped delay line. The second, fine, tapped delay line consists of number of delay elements with total delay equal to one element delay of the first, coarse, tapped delay line.

When the DCO signal is fed through the multi-stage tapped delay lines and taken from a given tap, the edge in the DCO signal will be somewhere between the two edges of the DCO clock.

The point where the signal has to be tapped from the delay line is determined by the remainder term of the DCO when it generates an edge. The remainder term indicates the delay in generation of the edge.

The smaller the remainder the more timely is the edge generation. This can be seen from the following simple illustration. If the adder capacity is 8, and the word added is 4, each time the adder overflows there will be a remainder of zero, indicating the carry pulse is one time. However, if, for example, the added term is 3, the adder will overflow prematurely, i.e. when there is a remainder of 1 in the register, and this remainder thus represents the timing error.

When the adder 16 in the DCO reaches an overflow condition, the carry toggles the output signal, and thus generates an edge in the DCO output signal $F_{gen}$. The capacitance Q of the DCO represents one cycle of the system clock on which the DCO runs. The DCO has a remainder term when an edge $F_{gen}$ is generated, and the term R represents the time error $t_{err}$ which is a fraction of the clock period $t_{clk}$ of the system clock.

$$t_{err}=(R/P).t_{clk}.$$

In FIG. 4, the output and remainder term of a DCO with Q=10 is shown. With P=8, the DCO generates a frequency ⅘ of the system clock.

It can easily be seen that the frequency of the DCO output signal is correct, but the edges are too late. The larger the remainder term, the later the edge. The first edge has a remainder term of 6. This means that the edge is ⅝=0.75 clock cycle too late. When the remainder term is 0, the edge is right on time.

The edge from the DCO has to be advanced in time by the term $t_{err}$ in the formula above. This is achieved by delaying the edge with t, the complement of $t_{err}$.

$$t_{del}=(1-R/P)t_{clk}$$

The delay calculation uses the assumption that a certain number of delay elements "fits" in one clock cycle. However, through temperature, voltage and process variations this is very irregular. Therefore, the delay line provides a maximum length that is suited for the worst case condition according to the process of the implementation. Also a measurement is performed to calculate the number of delay elements that fits in a single system clock cycle. For this reason, a ring oscillator 22 consisting of a chain of the delay elements of the coarse tapped delay line connected in series with a small delay inversion.

Figure 10:
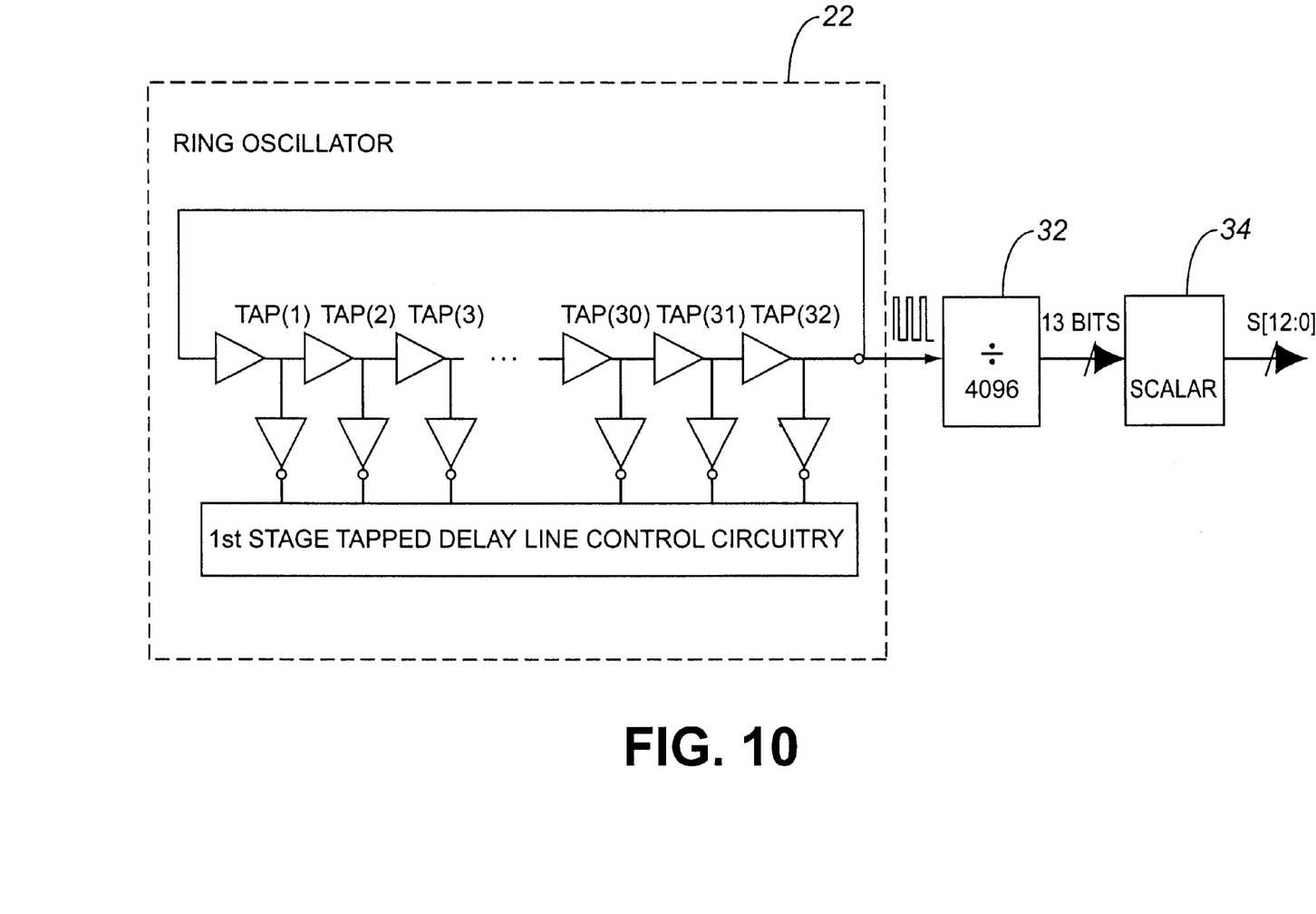
FIG. 10 is a block diagram illustrating detail of ring oscillator of FIG. 2.

In FIG. 10, the output frequency of the ring oscillator 22 is fed to a counter 32, which counts the pulses from a ring oscillator at a rate of 20 MHz/4096,or 4,882.8 Hz. The running frequency of the ring oscillator is varying from 5 MHz in the slowest case up to 20 MHz in the fastest case. This delay does not precisely scale the delay of the multi-stage tapped-delay line. A pre-calculated scalar 34 is used to compensate for the difference in both delays. The output of the counter, 13 bits, is fed to the pre-calculated scalar. The output of the scalar determines the number of delay elements in one complete system cycle.

This number is combined with the remainder term to calculate the precise tap that should be used as described below.

The remainder term provided by the DCO is much larger than the tapped delay can cope with; our implementation uses 13 bits of the remainder term; 6 bits for the coarse tapped delay line, 3 bits for the fine tapped delay line and 4 bits for the third, super fine, tapped delay line (used for 19.44 MHz). The number of taps guarantees sufficient phase accuracy over the full temperature and voltage range while the size of the circuitry remains acceptable.

The outputs of DCO consist of a clock (basically 8.192 MHz) and a remainder term. The remainder term is used directly for the driving of a pair of multi-stage tapped delay lines to generate a 16.834 MHz clock, and this clock drives dividers to generate the C8, C4, C2, GCI_FP8, ST_FP8 and ST_FP2 signals.

The DCO can be extended with, for instance, 11 bits extra on the adder stage. The added 11 bits always indicate a number of whole cycles that are generated by the original DCO. If one takes the contents of the whole DCO plus extension and performs the multiplication 193/256 or 1215/1024, the results can be used for accurate generation of a frequency which is 193/256×8.192 MHz=6.17 MHz, and 1215/1024×8.192 MHz=9.72 MHz. Those frequencies are in turn used to generate respectively the frequency 12.352 MHz required for T1 and the 19.44 MHz. The 19.44 MHz clock is multiplied 8 times through a frequency multiplier 70 to generate STS3/OC3 (155.5 MHz) clock.

A pair of multi-stage tapped delay line is used for each 12.352 MHz and 19.44 MHz clocks.

The multiplication by 193 is performed using shift and add functions: 193 equals 128+64+1. The multiplication by 1215 is performed using shift and add functions: 1215 equals 1024+128+64−1. Those however are only done for the few bits that have significance on the output. The lower bits of the DCO are not of interest since the accuracy of the delay lines for T1, E1 and STS3/OC3 demand limited phase accuracy. (The DCO itself is of course very long since not only does the phase accuracy have a minimal quality, but also the frequency, and this adds extra bits). The most significant bits that would result from the multiplication are of no interest since they represent whole cycles.

Figure 5:
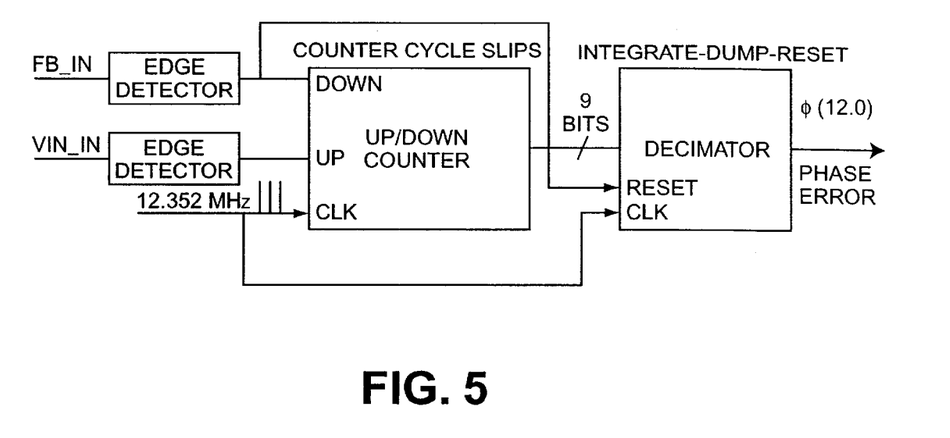
FIG. 5 is a block diagram illustrating details of the phase detector of FIG. 2.

The phase detector will now be described in more detail with reference to FIG. 5. As shown in FIG. 5, this comprises two edge detectors on VIR_IN and FB_IN, an up/down cycle-slip counter, and a decimator. The phase detector receives two input clocks, the first input, VIR_IN, is connected to the output of MTIE, and the second input, FB_IN, is a feedback clock from the multi-stage tapped delay line.

At the falling edge of FB_IN, the counter counts one step down and at the falling edge of VIR_IN, it counts one step up. Since the FB_IN input clock signal has a 50% duty cycle, when in lock, the rising edge of FB_IN is aligned with the falling edge of VIR_IN.

The decimator is an integrate and dump circuit. It integrates the cycle slip count with an accumulator clocked by a 12.352 MHz clock. This accumulator is cleared with each falling edge of the FB_IN after the accumulated value has been latched and fed forward to the limiter.

The limiter is to limit the phase alignment speed. The limiter limits the output value of the phase detector to be within the range of +2089, −2089 for T1 applications; +48, −48 for SONET applications. The proportional integrator filter integrates the limited phase value from the phase detector/limiter. The limiter output value is latched since the phase detector and limiter are running on 12.352 MHz while PI-filter runs on 20 MHz. The input value is the proportional part P. The integrator accumulates the P value with a rate of 1.544 MHz. The C1.5 output is used as enable for the integrator. In free run mode, it is at rest. In normal mode, the sum of P and I is output value that goes to DCO. This represents the deviation of the center frequency.

Since the average of P is 0 when the PLL is in lock, the integrator output represents the frequency offset. Therefore the range of the integrator, the frequency locking range, defines the limitation of the frequency offset. The output of the integrator is stored into one of the two holdover memory registers every 32 msec.

When the PLL is switched into holdover mode the oldest value is selected as output of the PI-filter. During holdover mode the other register keeps loading the I value every 32 ms but since the P value is 0, the integrator is not changing.

Figure 7:
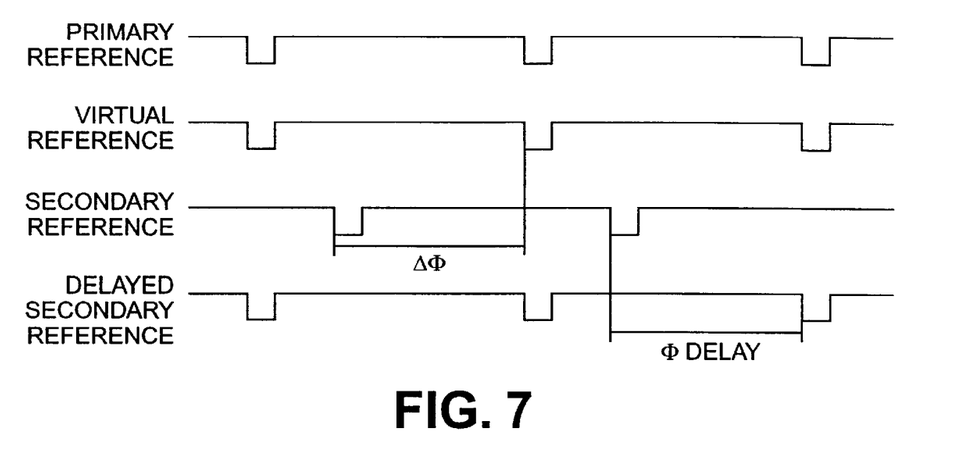
FIG. 7 is a timing diagram associated with the phase detector of FIG. 2.

The MTIE circuit will now be described in more detail with reference to FIG. 7, which shows the primary and secondary PRI, SEC, input signals to the multiplexer circuit. The MTIE creates a virtual reference, which has a constant phase relationship to the primary reference PRI. The phase deference can be in fact zero, so that the virtual reference is in phase with the primary reference, although the actual phase deference is not important. The secondary reference SEC is phase shifted by an amount $\Delta\phi$, which is continually monitored.

The secondary reference is delayed by an amount equal $\Delta\phi$ so as to bring the delayed secondary reference into phase with the virtual reference. Thus, when it becomes necessary to change over references due to degradation of the primary reference, no phase jump is observed since the phase derived from the secondary reference is maintained in phase with the previous reference derived from the primary reference.

The shift amount is determined before the switch over takes place by measuring the phase distance between the current virtual reference and the not yet selected reference.

An important feature is the use of the regenerated clock (16.384 MHz for E1, 12.3352 MHz for T1, or 19.44 MHz for STS/OC3) as a sampling clock. If the 20 MHz clock were used, sampling inaccuracy in the steady state would result and this would introduce low frequency drifts relative to the reference with a maximum value of 50 nsec. Though this is acceptable according to the specifications, the better performance is preferred.

Each time a measurement is completed the result is stored in a register. Upon switchover, the measured value can be used to drive a counter that generates the phase shift of the new reference. In this counter the new reference is used to start the counter and generate a new reference pulse at the 0 position. A detail in this process is that if a new reference pulse is detected and the counter has not reached the 0 position yet, the virtual reference is generated just the same while starting a new count cycle; if this mechanism were not be present cycle slips might occur.

The switchover from one reference to another is guarded. After selection of the new reference input, the circuit waits for three periods of the virtual reference before it can switch back to the previous reference signal. This is the maximum settling time of the mechanism that measures the phase difference between the to-be-used reference and the current virtual reference. Fast switching between reference inputs can therefore not disrupt the functioning of the MTIE circuit.

The MTIE circuit behaves identically for STS3/OC3, T1, E1 and 8 kHz references.

The MTIE circuit thus samples the reference clocks and determines the phase relation between the not used external and the used external reference. The phase relation is stored as a simple counter value. Upon a rearrangement the value is used to delay the new references edges to a more correct position in the MTIE sense. A simple, loadable down counter does this.

If the down counter, after rearrangement, reaches the 0 position, the internal reference signal VIR (Virtual Internal Reference) is given. Upon a new detection of an edge on the external reference the counter starts again to count down. If the counter has not reached 0 yet, but an external reference edge is already detected (which basically is too early and points to jitter, small or large) the counter is directly reset to start counting again, while a VIR is given. This is acceptable; this way the MTIE circuit just seems to pass the jitter, which is of coarse allowable.

The described phase locked loop can be used for synchronization and timing control for T1 and CEPT digital transmission links, ST-BUS clock and frame pulse sources, and multi trunk T1, E1 and STS-3/OC3 systems, for example.

In addition to providing synchronized PLL output at 2.048 MHz, 1.544 MHz, 8 kHz , or 19.44 MHz primary rate, the PLL can also provide additional high speed output clocks at rate of 3.088 MHz, 4.096 MHz, 8.192 MHz, 16.384 MHz, 19.44 MHz and 155.52 MHz for back frame synchronization and ATM, for example.

Figure 8:
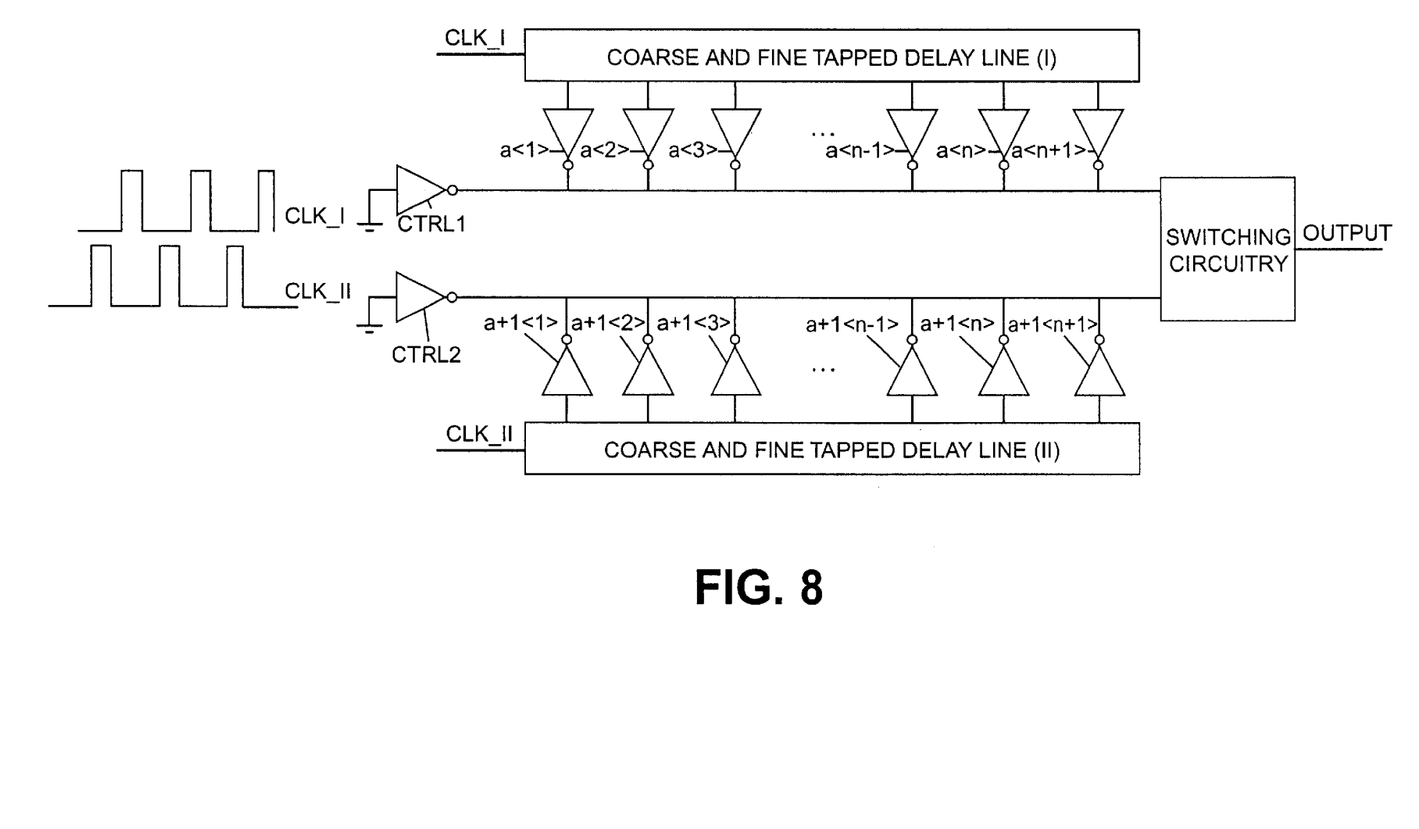
FIG. 8 is a block diagram illustrating details of multi-stage tapped delay line of FIG. 2.

The multi-stage tapped delay line circuit will now be described in more detail with reference to FIG. 8 and FIG. 9. In FIG. 8, the multi-stage tapped delay line is built actually from two multi-stage tapped delay lines and a number of tristate buses that are driven from these lines. The use of two lines permits switch over from one tap to another without running into dangerous timing problems. One multi-stage tapped delay line receives a pulse which is tapped with one tap, while the other tap is fully 0, but is being switched from one tap to another.

If no pulse at all is passed, no tri-state buffer is active. In order to keep the bus to a fixed value the bus is pulled down actively by extra tri-state buffers (with 0 on the data input).

The multi-stage tapped delay line receives the most significant 9 bits from the DCO for generating 16.384 MHz and 12.352 MHz clocks. For 12.352 MHz, the 9 bits are scaled down by 193/256 ratio. The granularity of the tapped delay is calculated by how precisely the delay element which equals 50 nsec $/2^9$=97 psec in the best case.

Since the circuit must operate over all temperature ranges, process and voltage variations (mil spec) the nominal, best case and worst case delay are important. The calibration measurement circuit (FIG. 10) is used to adjust the tap address resolution accordingly. The tapped delay is designed for a range of a factor 4.

The multi-stage tapped delay line is designed to receive most the significant 7 bits from the DCO in the slowest case. Therefore, the minimum granularity of the line=50 nsec/$2^7$= 390 psec which guarantees sufficient phase accuracy over the full temperature and voltage range for E1 and T1.

For a 19.44 MHz clock, the multi-stage tapped delay line has precisely the same behavior as for 16.384 MHz and 12.352 MHz, except that it receives 13 bits from the DCO to meet SONET Minimum Clocks specs for STS3/OC3 clock. The delay line granularity in the worst case equals 50 nsec/$2^{11-=24}$ psec.

As shown in FIG. 9, the multi-stage tapped delay line is comprised of two (three for STS3/OC3 19.44 MHz) stages tapped delay lines connected in series. The first stage is the coarse tapped delay line which is built with a series of 64 delay element, each equals 1/32 of the system clock period (50 nsec)=1.5625 nsec in nominal mode. The coarse tapped delay line is designed to guarantee a sufficient number of taps to fit into one system clock cycle over the full temperature and voltage operating range. The maximum number of taps are 64, with a smallest delay/tap=781 psec and the minimum number of taps is 16 corresponding to a largest delay/tap=3.125 nsec.

Each delay element is wire-ORed with a tri-state buffer. The tri-state buffers typically do not have the driving strength for 64 buffers on one line, so they are bundled in-groups of 16 and OR gated together.

The coarse tapped delay line receives the most significant 6 bits of the tap address (9 bits for E1 and T1, or 13 bits for STS3/OC3). The coarse tapped delay line receives a pulse, which is tapped to one predetermined tap. The predetermined tap is decoded by the 6 bit address. The resolution of the coarse tapped delay line is determined by one delay element.

The second stage is the fine, tapped delay line. The fine, tapped delay line is built with a series of 8 delay elements, each equals 1/8 of the coarse delay element, 1.5625 nsec/8= 195 psec in nominal mode, 97.6 psec in the best case, or 390 psec in the worst case. The delay element is designed to have a fixed ratio (1/8) to the coarse delay element in all temperature and voltage operating ranges, as any mismatch between them will appear as a jitter at the output clock. In reality, there is ~25 psec mismatch between the two delay elements in the worst case, which produces a maximum 200 psec jitter at the output. The fine tapped delay line receives the output pulse of the coarse tapped delay line. One tap of the fine delay line is selected using the least significant; 3 bits for the case of the E1 and T1 clocks.

In STS3/OC3, the fine tapped delay line receives the [6:4] bits of the tap address where the coarse tapped delay line receives [12:7] bits. The resolution of the fine tapped delay line is determined by one delay element.

The two stage tapped delay line produces the same resolution as one 512 single stage tapped delay line with a delay element equal to 195 psec with a small error ($e_{mm}$). The error can be calculated from the following equation:

$$e_{mn} = e_{mis}\left[\sum_{r=0}^{m-n-1} 2^r b_r + 1\right]$$

Where "m" is the whole tape address bits, "n" is the coarse tap address bits, "br" is the bit address and $e_{mis}$ is the mismatch error between the coarse element and the fine element.

The two stages of tapped delay lines are sufficient to meet the ACCUNET specs for E1 and T1, but not sufficient to meet SMC specs for STS3/OC3 clock, therefore a third stage of tapped delay line is added.

In STS3/OC3 clock, the third stage tapped delay line is build with a series of 16 delay element, each equal 1/16 of the fine delay element plus a fixed delay. The difference in delay between any two consecutive delay elements is 195 psec/16=12.2 psec in nominal mode. The third tapped delay line receives the least significant 4 bits of the 13 bit tap address.

The third tapped delay line receives the output pulse from the fine tapped delay line where the pulse is tapped to a predetermined tap that has been decoded from the 4 bit address. The mismatch in delay between the coarse element and fine element is measured and loaded into the third tapped delay line by tapped delay line control circuitry. The total granularity of the three stage tapped delay line equals 24 psec in the worst case which is sufficient for SMC specs.

The total mismatch in delay between the coarse element and fine element is measured by using a second configuration of a ring oscillator and integrator same as illustrated in FIG. 10, with some difference in the delay chain of the ring oscillator.

The first configuration consists of a ring oscillator having thirty-two delay elements of a coarse tapped delay line with small delay inversion. The output clock ring oscillator is fed to an integrator to be counted over a fixed time period ~200 micro second, every 4,882.8 Hz. The counter output is fed to a precalculated scalar to compensate for non-linearity of the ring oscillator. The reading of the first scalar is combined with the remainder term of the DCO to calculate the precise tap, predetermined tap address, 13 bits. This predetermined tap address controls the tapped delay line as discussed early.

The second configuration consists of a ring oscillator which consists of twenty-four delay elements of a coarse tapped delay line in series with sixty-four delay elements of a fine tapped delay line and a small delay inversion. The output clock of the ring oscillator is fed to an integrator to be counted over a fixed time period ~200 micro second, every 4,882.8 Hz. The second counter output is fed to a pre-calculated scalar to compensate for non-linearity of the ring oscillator. The reading of a second scalar is combined with the reading of the first scalar to calculate the error delay due to the mismatch between the coarse element and fine element.

The error delay due to the mismatch is measured and loaded into the third tapped delay line. The updated tap address of the third tapped delay line can be found from the following equation:

$$b_n = a[3:0] + 64 \times [S2/S1-1]$$

Where "bn" is the updated tap address of the third tapped delay, "a[3:0]" is the original predetermined tap address of the third tapped delay line, S1 is the reading of the first scalar, S2 is reading of second scalar.

The phase locked loop has four modes of operation, namely normal and manual mode, holdover mode, free run mode, and automatic mode.

In manual mode operation, the input reference selection is accomplished using a 2-to-1 multiplexer, with the RSEL pin providing selection control. As shown in Table 2, for MANUAL mode operation RSEL=0 selects PRI as the primary reference input, while RSEL=1 selects SEC as the primary reference input.

TABLE 2

| Mode | RSEL | Reference Input Selected |
| --- | --- | --- |
| Manual | 0 | PRI |
| Manual | 1 | SEC |
| Automatic | 0 | State machine control |
| Automatic | 1 | State machine control but treats SEC as primary and PRI as secondary |

There are four possible input frequencies for selections as the primary reference clock. There are 8 kHz, 1.544 MHz, 2.048 MHz, and 19.44 MHz. Frequency selection is controlled by the logic levels of FSEL1 and FSEL2, as shown in Table 3. This variety of input frequencies was chosen to allow the generation of all necessary T1, E1 and SMC from T1, E1, frame pulse reference source, or STS-3/OC-3 reference.

TABLE 3

| FSEL1 | FSEL2 | Input Reference Frequency |
|---|---|---|
| 0 | 0 | 19.44 MHz |
| 0 | 1 | 8 kHz |
| 1 | 0 | 1.544 MHz |
| 1 | 1 | 2.048 MHz |

In normal AUTOMATIC mode operation, the REFSEL input (FIG. 2) is set to 0 to allow the STATE MACHINE to select the reference input based on the state of the LOSS1 and LOSS2 inputs. If the PRI reference signal is lost (LOSS1=HIGH, LOSS2=LOW), then the PLL enters HOLDOVER mode immediately and stays there for a predetermined time as controlled by the RC time constant connected to the Guard Time input (Gti, Gto).

After the guard time has been exceeded, the reference will be switched to SEC if the primary reference continues to remain lost. The time constant determined by the RC circuit connected to the Gti input provides the hysteresis on automatic switching between PRI and SEC during very short interruptions on the primary reference signal. The Guard Time, $t_{gi}$, can be predicated using the step response of a RC network. The capacitor voltage on the RC circuit is described by an exponential curve. When the capacitor voltage reaches the positive going threshold of Gti, a logic HIGH level results. This causes the state machine to move from the holdover state of PRI to the state of using SEC as the input reference.

The STATE MACHINE continues to monitor the LOSS1 input and switches back the reference to PRI once the primary reference becomes functional as indicated by the LOSS1 input. A logic level HIGH on both the LOSS1 or LOSS2 inputs indicates that none of the external references are available. Under these circumstances, the phase locked loop will be switched to the HOLDOVER STATE (within a specified rate of frame slip) until a fully functional reference input is available.

The holdover option of the phase locked loop provides the user with the capability of maintaining the integrity of output signals when the input reference signals are lost. Holdover performance specified as the rate of slip (i.e. amount of slip in 60 seconds) of the 8 kHz reference input. For both the T1 and E1 outputs the rate of slip was measured as a function of the input reference frequency. The results measured over an observation period of 60 seconds are presented in Table 4.

TABLE 4

| Reference Input Frequency | % of Frame Pulse Slip |
|---|---|
| 8 kHz | 8% |
| 1.544 MHz | 58% |
| 2.048 MHz | 58% |
| 19.44 MHz | 58% |

As indicated, the phase locked loop uses its own generated frequency for sampling in data on the reference inputs. The reason for doing so is that this achieves synchronous sampling, giving best performance for intrinsic jitter. If the 20 MHz clock were used the accuracy would fall, especially on the low frequency wander aspect.

The circuit is truly asynchronous to the outside world, but also asynchronous on its internals.

The points where the major blocks of the circuit interface occur in an asynchronous way are all sampled with a D-flip flop to cover this.

Basically it detects edges on incoming signals and decides for two counters whether to count up or down and, in the case of inter counter, when to reset. The problem lies in the relation of the two elements.

The E1 dividers take the generated 16 MHz clock and divide it to the right frequencies, including the FP2 and FP8 pulses. The reset is the only asynchronous detail. Since the rest of the circuit is also reset this never gives problems.

The T1 divider circuits take the CLK12 clock (from the tapped delay) and divides it to the right frequency. However there is one problem in the form of the phase relation between E1, T1 and the FP8 pulse. The T1 circuit is reset around the FP8 pulses to ensure the correct phase relationship. However, this is never the case for a once reset T1 phase as it should always be in the correct phase position at the place where the reset occurs; the reset then is at the right moment and does not make any difference in the send that the T1 dividers would have to come to the same positions without the reset.

The described phase locked loop thus provides an inexpensive method of recovering clock signals; for example in an E1, T1 or STS3/OC-3 environment, that meets ACCUNET and SONET Minimum Clocks specifications. The phase locked loop particularly lends itself to large-scale integration into a single chip.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

We claim:

1. A digital phase locked loop for generating a stable output clock signal from at least one reference frequency signal, comprising:

a phase detector for detecting a phase difference between said reference frequency signal and said stable output clock signal and producing a phase error signal representative of the phase difference;

a digital controlled oscillator for receiving said phase error signal and generating an output signal at a desired frequency and a control signal representing a time error in said output signal;

a stable local oscillator for providing a clock signal to said digital controlled oscillator;

a plurality of tapped delay lines for generating said stable output clock signal each of said tapped delay lines comprising a plurality of delay elements, the sum of the delay of each of said plurality of tapped delay lines being less than the period of said output signal of said digital controlled oscillator; each of said plurality of tapped delay lines including a coarse, tapped delay line for receiving the output signal of said digital controlled oscillator; and a fine, tapped delay line for receiving the output signal of said coarse tapped delay line, said fine tapped delay line having a plurality of delay elements having a delay time proportional to one of said coarse tapped delay line delay elements; and at least one ring oscillator comprising a plurality of said tapped delay elements for producing a clock output signal for controlling said coarse and fine tapped delay lines.

2. A digital phase locked loop as claimed in claim 1, wherein said coarse tapped delay line has 64 coarse delay elements.

3. A digital phase locked loop as claimed in claim 1, wherein said fine tapped delay line has 8 fine delay elements.

4. A digital phase locked loop as claimed in claim 1, wherein a delay time of each of delay elements of said fine tapped delay line is ⅛ of a delay time of each of delay elements.

5. A digital phase locked loop as claimed in claim 1, wherein said phase detector is binary coded.

6. A digital phase locked loop as claimed in claim 1, wherein said phase detector is clocked by another clock signal.

7. A digital phase locked loop as claimed in claim 1, wherein said ring oscillator has 32 coarse delay elements.

8. A digital phase locked loop as claimed in claim 1, wherein each of said plurality of tapped delay lines further comprising a finer tapped delay line, said finer tapped delay line having a plurality of delay elements having a time delay proportional to one of said fine tapped delay elements.

9. A digital phase locked loop for generating a stable output clock signal from at least one reference frequency signal, comprising:
   a phase detector for detecting a phase difference between said reference frequency signal and said stable clock signal and producing a phase error signal representative of the phase difference;
   a digital controlled oscillator for receiving said phase error signal and generating an output signal at a desired frequency and a control signal representing a time error in said output signal;
   a stable local oscillator for providing clock signal to said digital controlled oscillator;
   a plurality of tapped delay lines for generating said stable output clock signal, each of said tapped delay lines comprising a plurality of delay elements, the sum of the delay of each of said plurality of tapped delay lines being less than the period of said output signal of said digital controlled oscillator; each of said plurality of tapped delay lines having a coarse, tapped delay line for receiving the output signal of said digital controlled oscillator; and a fine, tapped delay line for receiving the output signal of said coarse tapped delay line, said fine tapped delay line having a plurality of delay elements having a delay time proportional to one of said coarse tapped delay elements;
   a plurality of ring oscillators each one having a plurality of said tapped delay elements for producing a clock signal; and
   a plurality of counter/scaler devices to integrate the clock output signal of said plurality of ring oscillators and produce a control output signal for calibrating said control signal of said digital controlled oscillator.

10. A digital phase locked loop as claimed in claim 9, wherein each of said plurality of tapped delay times further having a finer tapped delay line, said finer tapped delay line comprising a plurality of delay elements having a time delay proportional to one of said fine tapped delay elements.

11. A digital phase locked loop as claimed in claim 9, wherein each of said counter/scaler devices has two digital counters.

12. A digital phase locked loop as claimed in claim 9, further comprising a fraction multiplier for deriving from the output of said digital controlled oscillator a signal at a frequency which is a fraction of the output frequency of the said digital controlled oscillator.

13. A digital phase locked loop as claimed in claim 9, further comprising an input circuit having two input signals for receiving respective first and second input signals, either one of said input signals being capable of serving as said reference frequency signal of said phase detector; and means for generating, upon changeover from one input signal to the other, said reference frequency signal having a constant phase relationship to said two input signals such that any phase jump occurring on changeover between said input signals is minimized.

14. A digital phase locked loop as claimed in claim 9, further comprising a multiplifer for multiplying said stable output clock signal to higher frequency clocks.

15. A frequency synthesizer for synthesizing a stable output clock signal from a reference clock signal comprising:
   a digital controlled oscillator for receiving said reference clock signal and generating an output signal at a desired frequency and a control signal representing a time error in said output signal;
   a stable lock oscillator for providing a clock signal to said digital controlled oscillator;
   a plurality of tapped delay lines for generating said output clock signal, each of said tapped delay lines having a plurality of delay elements, the sum of the delay of each of said plurality of tapped delay lines being less than the period of said output signal of said digital controlled oscillator; each of said plurality of tapped delay lines including a coarse, tapped delay line for receiving the output signal of said digital controlled oscillator; and a fine, tapped delay line for receiving the output signal of said coarse tapped delay line, said fine tapped delay line comprising a plurality of delay elements having a delay time proportional to one of said coarse tapped delay elements;
   a plurality of ring oscillators each one comprising a plurality of said tapped delay elements for producing a clock output signal; and
   a plurality of counter/scaler devices to integrate the clock output signal of said plurality of ring oscillators and produce a control output signal for calibrating said control signal of said digital controlled oscillator;
   wherein said digital controlled oscillator is an adding type rate multiplier that generates said output signal when attaining an overflow condition, a remainder term upon attainment of said overflow condition generating said control signal.

16. A frequency synthesizer as claimed in claim 15, wherein each of said plurality of tapped delay lines further having a finer tapped delay line, said finer tapped delay line comprising a plurality of delay elements having a time delay proportional to one of said fine tapped delay elements.

17. A method of synthesizing a frequency from a clock reference comprising the steps of:
   generating lock clock signals with a stable oscillator; clocking a digital controlled oscillator with said local clock signals; feeding a first output of said digital controlled oscillator to a first tapped delay line; feeding an output of said first tapped delay line to second tapped delay line; wherein said second tapped delay line has a delayed time proportional relationship to said first tapped delay line; generating a delay measuring ratio signal with a ring oscillator said ring oscillator having a delay proportional to said first and second tapped delay lines; correcting a second output of said digital controlled oscillator with said delay measuring ratio signal to generate a corrected time error signal in said first output of said digital controlled oscillator; controlling said first and second tapped delay lines with said corrected time error signal to generate clock signals at desired frequencies having a precision greater than one clock cycle of said stable oscillator.

* * * * *